US006251562B1

(12) United States Patent
Breyta et al.

(10) Patent No.: US 6,251,562 B1
(45) Date of Patent: Jun. 26, 2001

(54) ANTIREFLECTIVE POLYMER AND METHOD OF USE

(75) Inventors: Gregory Breyta, San Jose; Thomas Carl Clarke, Morgan Hill; Daniel Joseph Dawson, San Jose; Ronald P. Esch, San Jose; Alfred Floyd Renaldo, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/219,586

(22) Filed: Dec. 23, 1998

(51) Int. Cl.$^7$ .............................. G03C 1/825; G03C 1/73
(52) U.S. Cl. .................................. 430/287.1; 430/286.1; 430/281.1; 430/313; 430/314; 430/909; 524/80
(58) Field of Search .................................. 430/9, 11, 14, 430/155, 156, 270.1, 271.1, 281.1, 286.1, 311, 313, 325, 909

(56) References Cited

U.S. PATENT DOCUMENTS

| 4,910,122 | | 3/1990 | Arnold et al. . | |
|---|---|---|---|---|
| 4,910,123 | | 3/1990 | Endo et al. . | |
| 5,532,109 | * | 7/1996 | Krounbi et al. | 430/271.1 |
| 5,604,073 | | 2/1997 | Krounbi et al. . | |
| 5,652,297 | | 7/1997 | McCullouch et al. . | |
| 5,652,317 | | 7/1997 | McCulloch et al. . | |
| 5,654,376 | | 8/1997 | Knors et al. . | |
| 5,733,714 | | 3/1998 | McCulloch et al. . | |
| 5,981,145 | * | 11/1999 | Ding et al. | 430/271.1 |
| 5,994,430 | * | 11/1999 | Ding et al. | 524/80 |

FOREIGN PATENT DOCUMENTS 59-017549 * 1/1984 (JP) .

OTHER PUBLICATIONS

Levinson, H. et al., "Handbook of Microlithography, Micromachining, and Microfabrication", *The Institution of Electrical Engineers*, 1:42–56 (Date Unknown).

Sturtevant, J. et al., "Antireflection Coating Process Characterization and Improvement for DUV Lithograpphy at 0.25 $\mu$m Groundrules", *SPIE*, 2440:582–593 (Date Unknown).

Sturtevant, J. et al., "Antireflection strategies for advanced photolithography", *Microlithography World*, pp. 13–21 (Autumn 1995).

* cited by examiner

Primary Examiner—Hoa Van Le
Assistant Examiner—Yvette M. Clarke
(74) Attorney, Agent, or Firm—Robert B. Martin

(57) ABSTRACT

An antireflective composition includes a polyphenolic polymer which has a first repeating unit and a second repeating unit of the formula:

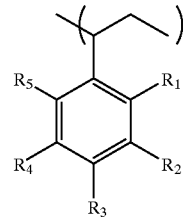

wherein each of $R_1$, $R_2$, $R_3$, $R_4$, and $R_5$ is individually a hydroxy group, hydrogen or an azo dye and only one of $R_1$, $R_2$, $R_3$, R4, and $R_5$ is a hydroxy group.

2 Claims, 1 Drawing Sheet

FIGURE
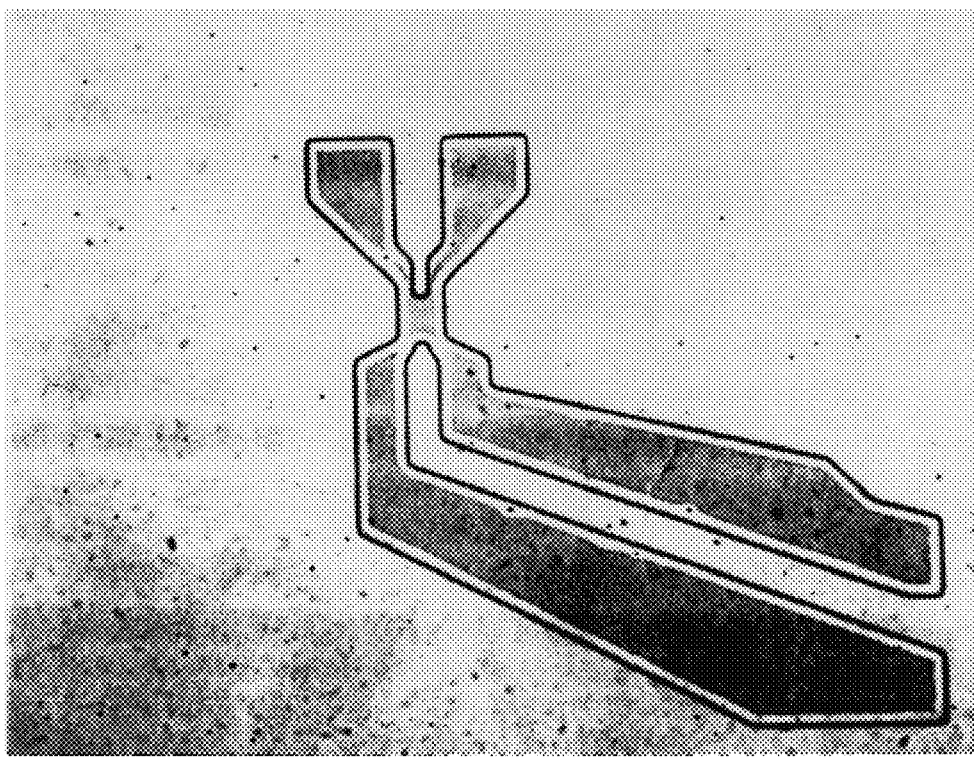

ANTIREFLECTIVE POLYMER AND METHOD OF USE

FIELD OF THE INVENTION

The invention relates generally to a process of forming patterned underlying antireflective coatings with microlithographic photoresists. More particularly, the invention relates to antireflective polymers comprising a visible colorant.

BACKGROUND OF THE INVENTION

In the fabrication of integrated circuits, the exposure of a photoresist to light is an integral process step. The production of high density circuits having submicron dimensions requires that such exposure be accomplished within close processing tolerances. For example, it is important to control the linewidth of the imaged and developed photoresist so that any deviation from the nominal design linewidth over non-planar or reflective features is small, typically less than 10%.

The difficulty in controlling linewidth in high resolution photoresist patterns over reflective topography is well documented. See, for example, D. Widmann and H. Binder, *IEEE Trans. Electron Devices*, ED22, 467 (1975). When photoresist layers overlaying reflective substrates are exposed using monochromatic light sources, a constructive interference pattern between the normally incident exposing light and light reflected from the substrate is created in the resist. The resulting pattern of optical nodes and antinodes which is normal to the plane of the reflective interface, and repeats along the optical axis, is the cause of localized variations in the effective dose of exposing light. This phenomenon is known in the art as the interference or standing wave effect. Other pattern distortions are caused by light reflected angularly from topographical features and are discussed by M. Bolsen, G. Buhr, H. Merrem, and K. Van Werden, *Solid State Tech.*, Feb. 1986, 83. These distortions are known in the art as reflective notching.

The quantification of the interference effect can be measured by using the swing ratio (SR), set forth by T. Brunner, *SPIE*, 1466, 297 (1991), $$SR=4(R_1R_2)^{1/2}e^{aD}$$

where $R_1$ is the reflectivity of the resist/air interface and $R_2$ is the reflectivity of the resist/substrate interface at the exposing wavelength, a is the resist absorbtion coefficient, and D is the resist thickness. A low swing ratio implies that localized variations in the effective dose of exposing light are small, and thus the exposure dose is more uniform through the thickness of the film. One method to reduce the swing ratio is use of a photoresist or lithographic process which imparts a high numerical value in α or D, giving a high numerical value to the product of αD. Other methods for reducing the swing ratio are the use of coatings which reduce the contribution of $R_1$ or $R_2$, such as through the use of antireflective layers.

The lithographic techniques for overcoming the problems of forming patterns on reflective topography include dyes added to the photoresists as described in U.S. Pat. No. 4,575,480 to Kotani, et al., U.S. Pat. No. 4, 828,960 to Hertog, U.S. Pat. No. 4,882,260 to Kohara, et al., and U.S. Pat. No. 5,043,243 to Yajima, et al., top surface imaging (TSI) processes, multilayer resists (MLR) with added dyes as described in U.S. Pat. No. 4,370,405 to O'Toole, et al., top antireflective layers (TARL), bottom antireflective layers (BARL) which may comprise inorganic materials or organic materials, and coatings comprising polyamic acids or polybutene sulfone with added dyes.

When a dye is added to photoresist to form an optically sensitive film having high optical density at the wavelength of the exposing radiation, several problems may be encountered. These include sublimation of the dyes during baking of the films, loss of resist sensitivity, difficulties during deep ultra violet hardening processes which are commonly used with novolak comprising resists, thinning of the resists in alkaline developers, and distortion of the resulting relief image. TSI processes require high optical density at the wavelength of the exposing radiation and similar processing difficulties are often encountered. Furthermore, TSI and MLR processes are costly and complex.

Tanaka, et al., have disclosed the use of a TARL, as an optical element overlaying a photoresist layer, however, this approach is not effective in reducing top notching effects from underlaying reflective topography and also requires removal with hologenated solvents prior to the photoresist development step. T. Tanaka, N. Hasegwa, H. Shiraishi, and S. Okazaki, *J. Electrochem. Soc.*, 137, 3900 (1990).

Inorganic BARLs such as silicon require precise control of the film thickness, which for a typical 300 Å thick film is ∓10 Å. T. Pampalone, M. Camacho, B. Lee, and E. Douglas, *J. Electrochem. Soc.*, 136, 1181 (1989). Pampalone has described the use of titanium oxynitrides on aluminum surfaces to reduce reflectivity from 85% to 25%, however, TiNxOy processes require special deposition-equipment, complex adhesion promotion techniques prior to resist application, a separate dry etching pattern transfer step, and dry etching for removal. Horn has disclosed the similar use of titanium nitride antireflective coatings, however, such coatings are often incorporated into the completed semiconductor device as a permanent element, thus TiN coatings are not suitable for use with every photolithographic layer. M. Horn, *Solid State Tech.*, November 1991, 58.

U.S. Pat. No. 4,910,122 to Arnold, et al., discloses organic BARLs comprising polyamnic acids or polybutene sulfones with added dyes. The films derived from the polyamic acid compositions are cured by baking at a temperature of at least 148° C. for 30 minutes. Pampalone has noted that the baking conditions must be carefully controlled to prevent the occurrence of oversized or undersized relief images in the imaged and developed photoresist relief images in the imaged and developed photoresist. Horn has noted that the BARL tended to peel or leave a residual scum. The polyamic acid based BARL is also developed with alkaline developer of the resist. Concurrently, any Al layers which may be in contact with the BARL are attacked by the alkaline developer, which may cause lifting of the BARL and resist layer.

The films derived from polybutene sulfone with coumarin dyes require coating thicknesses of 2.0 μm and baking at 140° C. for 60 minutes. The 2.0 μm thick film of polybutene sulfone may tend to fill in and planarize deep trenches, resulting in localized regions having a film thicker than 2.0 μm, and requiring plasma over etching to remove the film. The use of a 2.0 μm layer with an added 1.0 μm resist layer may exceed the usual depth of focus of less than 2 μm for advanced, higher numerical aperture exposure tools. In addition, long bake times are not compatible with a rapid throughput cluster tool processing strategy, thus, such materials may require additional or separate long coating or baking steps that add process costs. Polybutene sulfone is also thermally unstable at temperatures above about 120° C. and may decompose with out gassing. This may lift the overlying resist during deep ultra violet hardening or Al etching where the wafer temperature may reach 150° C.

Furthermore the antireflective coating can be used within a bi-layer resist lift-off process in the fabrication of integrated circuit components and other thin film structures such as field effect transistors (FET), conductor patterns and magnetic sensing transducers. These types of devices are well known in the art. For example, U.S. Pat. No. 4,814,258 granted to Tam discloses a bilayer lift-off process utilized for the fabrication of various types of FET/s, and U.S. Pat. No. 5,604,073 granted to Krounbi discloses a bilayer metal lift-off process for forming lead conductors in a magnetoresistive (MR) sensor. In this case the release layer is a suitable material such as polydimethylglutarimide (PMGI), a polymer supplied by the Shipley Company.

Despite these disclosed processes there remains a need for antireflective coatings which may be used to decrease the swing ratio (SR) by lowering the relative reflectivity of the various interfaces in a resist system.

SUMMARY OF THE INVENTION

In accordance with a first aspect of the invention, there is provided an antireflective composition comprising a polyphenolic polymer said polymer comprising repeating monomeric units having the formula:

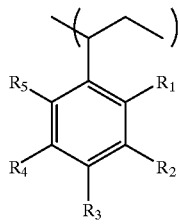

wherein each of $R_1$, $R_2$, $R_3$, $R_4$, and $R_5$ is individually a hydroxy group, hydrogen or an azo dye moiety, and only one of $R_1$, $R_2$, $R_3$, $R_4$, and $R_5$ is a hydroxy group. Optionally, the composition may be used as a lift-off layer.

The invention provides polymeric polyphenolic compositions which comprise various azo dye moieties that strongly absorbs ultraviolet light having a wavelength in the range from about 365 nm to about 436 nm, or from about 193 nm to about 300 nm.

The compositions of the invention may be dissolved in various aqueous and organic solvents to provide a composition which is useful for forming thin films. The present invention contemplates that the film may be formed by spin casting, extrusion coating, dipping, spraying, or other methods commonly known in the art. If desired, a photoresist film may be applied over the antireflective film. Photolithographic processes comprising the step of applying the antireflective film prior to the patternwise or blanket exposure of the photoresist have improved linewidth control resulting from a reduction of the standing wave effect and also from a reduction of the reflective notching effect.

The antireflective films of the invention have a high optical absorbance at the wavelength for which they are intended to be used. The optical density is not limited by dye solubility or phase separation. Thus, the film may be thinner than other antireflective films known in the art. Additionally, some alternative embodiments of the present invention have the unexpected advantage of a high refractive index at the wavelength for which they are intended to be used.

Furthermore, the antireflective films of the invention provide a low optical absorbance at wavelengths which are longer than the wavelengths for which they are intended to be used. For example, films derived from the disclosed compositions which are intended to be used with exposing light having a wavelength in the range from about 193 nm to about 300 nm are sufficiently transmissive at wavelengths longer than about 320 nm to permit film thickness measurements by interferometric techniques for process definition and control. Also, films intended for use with exposing light having a wavelength of about 365 nm are similarly transmissive at wavelengths longer than about 425 nm, and films intended for use with exposing light having a wavelength in the range from about 365 nm to about 436 nm are similarly transmissive at wavelengths longer than about 460 nm.

Another advantage of the present compositions is that the optical density is not decreased during subsequent processing steps by loss of the chromophore. It is known that heating of mixtures of volatile dyes in polymers to temperatures above the glass transition point of the polymer may cause the dye to sublime from the film. The disclosed compositions provide a thermally stable antireflective film which is not subject to decreases in optical density when treated at temperatures of up to about 250° C. Similarly, the diffusion of the chromophore into the photoresist layer during any subsequent baking of the resist is minimized or obviated. Furthermore, the chemically bound chromophore of the present invention is not extracted by solvent when a photoresist film is applied over the antireflective film. The disclosed compositions are particularly useful in conjunction with photoresist films cast from water or solvents comprising esters such as ethyl cellosolve acetate, ethyl ethoxy propionate, ethyl lactate, methyl cellosolve acetate, or propylene glycol acetate.

The film of the invention may be used for antireflective properties as well as for a release layer and may be coated with a variety of photoresist materials with little or no prior baking of the antireflective layer. A material which permits substrate coating in the same equipment as, and immediately prior to, the application of photoresist without a separate baking step, saves time and lowers process costs.

Additional uses and advantages of the present invention will become apparent to the skilled artisan upon reading the following detailed description of the invention and the preferred embodiments.

BRIEF DESCRIPTION OF THE DRAWINGS

The FIGURE illustrates the results obtained from Example 12.

DETAILED DESCRIPTION OF THE PREFERRED EMBODIMENTS

The invention comprises polymeric dye compositions which may be used to define antireflective coatings with microlithographic photoresists. Generally, the polymeric dye compositions comprise a polyphenolic polymer backbone having pendent azo dye moieties.

THE POLYMER

Incorporation of any azo dye moieties into polyvinylphenol (PVP) has been shown to produce outstanding antireflective properties in microlithographic processes and in a variety of photoresist compositions. Chemically, the azo class is subdivided according to the number of azo groups present into mono-, dis-, tris-, and tetrakis-, among others. Azo dyes contain at least one azo group (—N=N—) but can contain two (disazo), three (trisazo), or, more rarely, four or more (polyazo) azo groups. The azo group is attached to two radicals of which at least one, but more usually, both are aromatic. They exist in the trans form where the bond angle is about 120° and the nitrogen atoms are sp² hybridized and may be represented as follows in formula 1.

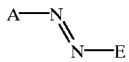
II

In monoazo dyes, the most important type, the A radical often contains electron-accepting groups, and the E radical contains electron-donating groups, particularly hydroxy and amino groups. If the dyes contain only aromatic radicals such as benzene and naphthalene, they are known as carbocyclic azo dyes. If they contain one or more heterocyclic radicals, the dyes are known as heterocyclic azo dyes.

All coupling components used to prepare azo dyes have the common feature of an active hydrogen atom bound to a carbon atom. Compounds of the following types can be used as azo coupling components: (1) aromatic hydroxy compounds such as phenols and naphthols; (2) aromatic amines; (3) compounds that possess enolizable ketone groups of aliphatic character, i.e., compounds that have active methylene groups, where X is an electron attracting group such as —COR, —COOH, —CN, R is alkyl or aryl, and Y is usually a substituted or unsubstituted amino group;

III and (4) heterocyclic compounds such as those containing pyrrole [109-97- 7], indole [120 72-9], pyridine [11-86-1], pyrimidine [289-95-2], and similar ring systems, such as 5-pyrazolones.

Analogous to aromatic halogenation, nitration, and sulfonation, the azo coupling reaction is an electrophilic aromatic substitution. The effect of the reaction rate of substituents on both the diazo and the coupler components is in agreement with this mechanism. Thus the reaction is facilitated by electron-attracting groups in the diazo components, and by electron-donating groups in phenol and aromatic amine-type coupler components. The reactivity of coupling components (nucleophilic substrate) increases with increasing basicity. The phenoxide ion (ArO⁻) and free amine (ArNH₂) are more basic than corresponding free phenol and the ammonium ion ($C_6H_5NH_3^+$) and, therefore, react more easily.

Generally this antireflective composition includes a polyphenolic polymer with repeating units of the formula:

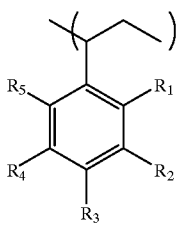
I wherein each of $R_1$, $R_2$, $R_3$, $R_4$, and $R_5$ are individually hydrogen, a hydroxy group or an azo dye moiety, and only one of $R_1$, $R_2$, $R_3$, $R_4$, and $R_5$ is a hydroxy group. $R_1$ through $R_5$ maybe any number of azo dye moieties including aromatic structures including phenyl, naphthyl, anthracenyl among others. Further substituents to these aromatic structures include $NO_2$, $SO_2Y$, COOR, OR, CN, $NR_2$, or a halogen wherein R is an alkyl and these substituents located at the ortho, meta, or para position.

Useful azo dyes include commercially available Fast-Dyes such as:

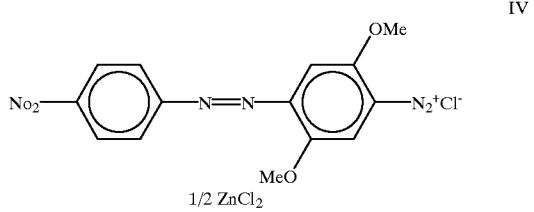
IV

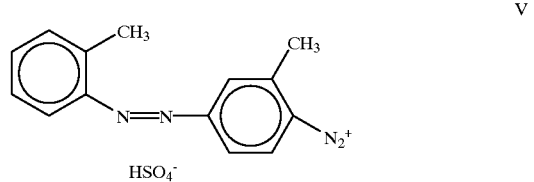
V

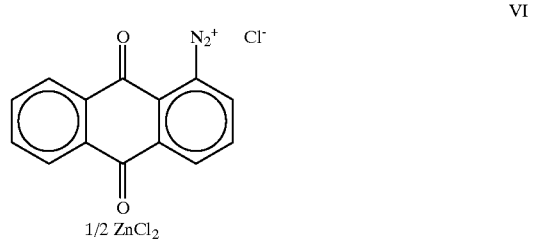
VI

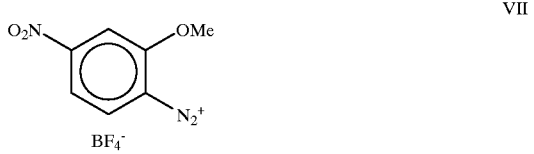
VII

In use, R—$R_5$ may be an azo dye or tirazole comprising alkyl groups, alkyl aryl groups, or substituted or unsubstitutes aryl groups such as benzene. These dyes may be joined through azo functionality at the site of the ionic bond by stripping the anion from the dye.

Typically $R_1$ through $R_5$ includes a monoazo dye of the formula:

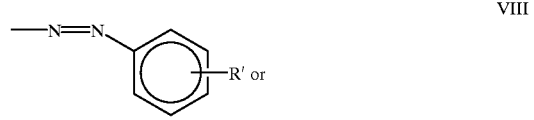
VIII

IX where R' and R" is an aryl alkyl, aryl or alkyl. Typically R' and R" include H; —OH; —OCH₃, —OCH₂CH₂CH₃; —COOH, —COCH₃, —COCH₂CH₃, —COCH₂CH₂CH₃ and SO₃H, and SO₂NH₂ among others.

The resulting polymer generally has a molecular weight (weight average) ranging from about 2000 to 80,000, and preferably from about 5000 to 15,000. The solubility of the polymer may be varied by increasing molecular weight or by including pendent moieties with varying pH sensitivities. For example, as the molecular weight of the polymer increases solubility generally decreases. Further, use of dye moieities with acidic pendent groups generally increases solubility in alkaline solutions. Further, use of dye moieties with alkyl or alkoxy pendent groups decreases solubility generally.

The polymer may also be mixed with any number of copolymers of varying types and molecular weights. Examples of useful copolymers include styrenics, acrylates and metharylates, vinylethers, alcohols, and acetates among other copolymers.

Preferably the antireflective composition is a terpolymer composition of two different azo dye components and a phenol component. The preferred terpolymer composition of the azo dyes is illustrated below.

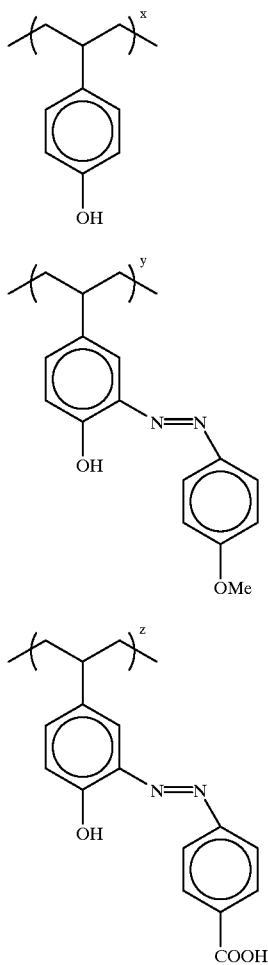

wherein x is 25, y is 50 and z is 25 mole-%, and x+y+z=1.

In one embodiment of the invention, the terpolymer composition illustrated above, is incorporated into the photoresist at concentrations in the range of 0.5 to 10 percent (by weight). The typical photoresist layer thickness can be from 500 angstroms to 2 µm thick. This layer is typically soft-baked at 130–200 ° C. for 10–30 minutes.

PROCESSING

In the disclosed compositions, the azo moiety is chemically linked to the polymer. The linkage results from any set of conditions giving rise to a reaction between the dye and the PVP polymer backbone. Once synthesized, the antireflective polymer may be used in an autonomous thin film or mixed with a photo resistive polymer.

In the most preferred embodiment, preparation of these polymers is by reaction of a diazonium salt directly with the phenolic polymer. However the desired polymeric structure can be achieved by polymerization of monomeric units containing the desired antireflective-promoting unit(s) and any other co-monomers.

In some applications it may be necessary to minimize or eliminate the use of material that may leave metal or halide ions in the product polymer after manufacture. Exchange of non-ionic or organic materials for metal halide containing materials, for example a tetraalkylammonium hydroxide for the sodium hydroxide and/or another non-halide acid such as trifluoracetic acid or trichloroacetic acid or a sulfuric or sulfonic acid.

The reaction of the fast dyes and other commercially available diazonium salts to phenolic polymer backbones is analagous to other reactions where diazonium salt are formed in situ. These materials would be reacted directly with the polymeric phenoxide followed by neutralization or acidification.

The polymeric compositions of the present invention may be dissolved in various aqueous or organic solvents to provide a composition which is useful for forming thin films. Particular examples of solvents include, without limitation, Γ-butyrolactone, cyclopentanone, cyclohexanone, dimethyl acetamide, dimethyl formamide, dimethyl sulfoxide, N-methylpyrrolidone, tetrahydro furfural alcohol, or combinations thereof. The preferred solvents are Γ-butyrolactone, cyclopentanone, and cyclohexanone. In an alternative embodiment, traces of a surfactant such as 3M Fluorad FC-430 may also be added.

The antireflective polymer of the invention may also be codeposited with a photoresist film. The polymeric compositions of the invention are characterized by being immiscible with the photoresist and essentially insoluble in the typical casting solvents used in diazoquinone novolak photoresist compositions. The artisan will appreciate that the typical casting solvents used in diazoquinone novolak photoresist compositions include, without limitation: (a) those solvents recited above wherein the instant compositions are disclosed herein to be particularly useful in conjunction with photoresist films cast from solvents comprising esters such as ethyl cellosolve acetate, ethyl ethoxy propionate, ethyl lactate, methyl cellosolve acetate, ethyl pyruvate or propylene glycol acetate; each is also a well known diazoquinone novolak photoresist solvent. The artisan will further appreciate that typical casting solvents used in diazoquinone novolak photoresist compositions also include, without limitation: (b) well known casting solvents for diazoquinone novolak photoresists such as the monooxymonocarboxylic acid esters and ethers thereof disclosed in European Patent Application EO 0-211-667-A to Japan Synthetic Rubber Co., Ltd., and in U.S. Pat. No. 4,943,511 to Lazarus, et al.; and (c), well known casting solvents for diazoquinone novolak photoresists such as the propylene glycol alkyl ethers and acetates thereof disclosed in U.S. Pat. No. 4,948, 697 to Durham, and; (d) the well known solvents diglyme and the alkyl cellosolves and acetate esters thereof. Furthermore, it is well known from the teachings of Lin, Multi-Layer Resist Systems, in Introduction to Microlithography, Thompson, Editor, and the artisan will appreciate, that an underlying film forming composition will be immiscible with an overlying photoresist composition if the resist casting solvent does not dissolve the underlying film forming composition, and conversely, an underlying film forming composition will be miscible with an overlying photoresist composition if the resist casting solvent dissolves or swells the underlying film forming composition.

The antireflective polymer may be made inert by copolymerizing the antireflective polymer with a copolymer having crosslinkable groups. The crosslinkable groups may be attached to the polymer backbone comprising comonomers of acrylate, vinyl cyclohexanol, cyanates and other substituted styrenes, among others crosslinkable groups. Alternatively, small compounds having crosslinkable groups may be intermixed and codeposited with the antireflective polymer of the invention. The crosslinking groups used within the antireflective polymer are typically methylol acrylamides, alcohols, cyanates, methacrylamides, ethylene end groups, epoxies, isocyanates, but methylol acrylamides and epoxy groups are preferred. Heating the antireflective film after the coating process induces crosslinking of the polymer and hence makes the coating insoluble in the aqueous developer. However, the crosslinking functionality must be stable in the solution of the antireflective polymer and crosslink when heated at temperatures greater than about 70° C. The crosslinking monomeric unit is represented by the following structure:

VIII

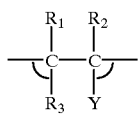

where Y contains the crosslinking functionality and $R_1$ to $R_3$ is H, $(C_1-C_4)$ alyl or $(C_1-C_4)$ alkoxy.

Specific examples of crosslinking functionality are shown in the following diagram but are not limited to, (1)

(2)

(3)

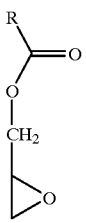

(4)

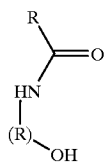

(5)

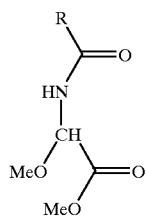

where (1) is a carbodiimide, (2) an isocyanate or blocked equivalent, (3) glycidyl acrylate or methacrylate, (4) an alkylol acrylamide or methacrylamide and, (5) methyl acrylamidoglycolate methyl ether, R is $(C_1-C_4)$ alkyl, and R' is H or $(C_1-C_4)$ alkyl.

The mole % of the dye containing polymer can range from about 5 to 95, and the mole % of the crosslinking agent can range from about 1 to about 50 in the final mixture. Additionally, the polymer may contain unreacted precursors and/or monomers from the synthetic steps of the preparation of the polymer.

The antireflective coating composition comprises the polymer of the instant invention and a suitable solvent or mixtures of solvents. Other components may be added to enhance the performance of the coating, e.g. monomeric crosslinking agents, monomeric dyes, lower alcohols, additives to promote crosslinking, surface leveling agents, adhesion promoters, antifoaming agents etc. Examples of crosslinking agents include, but are not limited to, melamines, hydroxy alkyl amides, epoxy and epoxy amine resins, blocked isocyanates, and divinyl monomers. Monomeric dyes may also be added to the antireflective coating, examples of which are sudan orange, 2,4-dinitronaphthol, curcumin, coumarins and others.

The absorption of the antireflective coating can be optimized for a certain wavelength or ranges of wavelengths by the suitable choice of substituents on the dye functionality. Using substituents that are electron-withdrawing or electron donating generally shifts the absorption wavelength to longer or shorter wavelengths, respectively. In addition, the solubility of the antireflective polymer in a particularly preferred solvent can be adjusted by the appropriate choice of substituents on the monomer. Generally, the polymer is developable in basic solvents and may be made inert to aqueous developer by crosslinking.

The polymer of the antireflective coating composition is present in the range of about 1% to about 30% by total weight of solution. The exact weight used is dependent on the molecular weight of the polymer and the film thickness of the coating desired. Typical solvents, used as mixtures or alone, that can be used are propylene glycol monomethyl ether (PGME), propylene glycol monomethyl etheracetate (PGMEA), ethyl lactate, cyclopentanone, cyclohexanone, and gamma butyrolactone, but PGME, PGMEA and ethyl lactate or mixtures thereof are preferred. Solvents with a lower degree of toxicity, and good coating and solubility properties are generally preferred.

Since the antireflective film is coated on top of the substrate and may be further subject to dye etching it is envisioned that the film is of sufficiently low metal ion level and purity that the properties of the semiconductor device are not adversely effected. Treatments such as passing a solution of the polymer through an ion exchange column, filteration, and an extraction process can be used to reduce the concentration of metal ions and to reduce particles.

The antireflective coating composition is coated on the substrate using techniques well know to those skilled in the art, such as dipping, spincoating or spraying. The film thickness of the antireflective coating ranges from about 0.1 micron to about 1 micron. The coating is further heated on a hot plate or convection oven to remove any residual solvent and to induce the appropriate degree of crosslinking in order to insolubilize the film.

Photoresists coated over the antireflective film can be any of the types used in the semiconductor industry provided the sensitivity of the photoactive compound in the photoresist matches that of the antireflective coating.

The concentration of solvent, polymer, and crosslinking agent will vary depending on the application. Generally film thickness and the relative concentration of polymer present should be adequate to provide the appropriate antireflective properties. The resulting antireflective layer has a k value preferably between 0.3 and 0.4, more preferably about 0.35 which provides antireflection properties at various actinic wavelengths such as 193 nm, 248 nm, and 365 nm among others. Generally, we have found that the use of about 50 mole-% of azo dye moieties in the polymer provides the appropriate absorbence. The balance of the polymer structure may be other crosslinkable comonomers to provide stability to the film during photolithographic processing. Generally, the use concentrations can be varied within the guideline concentrations provided below:

|  | Concentration (wt-%) |
|---|---|
| Solvent | 72–92 |
| Polymer | 3–10 |
| Crosslinking agent* | 0.3–8 |

*(When Present)

Generally, the organic underlayer may be applied by spin coating and then optionally heat baked at temperatures ranging from about 90° C. to 250° C. for a period of time sufficient to evaporate any solvent present and, if necessary, cure the polymer. The photoresist may then be deposited by spin-coating and developed using actinic radiation at 193 mn, 248, nm, 365 nm, or 435 nm. The image may then be developed using any developer known to those of skill in the art.

Working Examples

The following examples are a nonlimiting illustration of the invention. A high polymer absorbtivity for a thin film (<2000 Å) meets criteria as an antireflective coating to minimize swing curve effects:

$SR=4(R_1R_2)^{1/2}e^{-a^D}$ wherein $R_1$ =reflectivity resist/ air interface $R_2$ =reflectivity resist/substrate interface $\alpha$=resist absorbtion coefficient D=top resist thickness SR=swing ratio The polymer dye of the invention can effectively reduce $R_2$ enough to lower SR (swing ratio). Incorporation of a dye in polymer allows for a high absorbing dye moiety capable of being used at very thin film thickness. The use of the swing ratio (SR) equation suggests the need for an incorporation of dye into the polymer for a high absorbing moiety capable of being used at a very thin film. Typically polymer film thickness less that 2000 Å are required to either produce a suitable undercut with a liftoff bilayer process or effectively reduce the lateral etch bias during a dry etch process and including a limiting thickness of 1000A with p value of 70% at 365 nm (Typically for substrates coated with metal films) would require a k value of approximately 0.3–0.4 to effectively reduce reflection in substrate reflectivity. The commercially available release material, LOL-1000 (A lightly dyed PMGI formulation from Shipley Company) PMGI, used in a bilayer for a metal liftoff process has k value near zero (LOL-1000, has n-1.554 and k+0.028 at 365 nm).

Using the formula:

$$pe^{-zt}\frac{4\Pi K}{\lambda} \leq 0.1 \text{ wherein}$$

p=reflectivity (resist–substrate, typically 70%)

t=antireflective coating thickness (e.g. 1000 Å=100 nm)

$\lambda$=wavelength (e.g., 365 nm)

k=0.281, (imaginary refractive index or the complex extinction coefficient)

Thus a k value ≈0.3–0.4 is needed for effective reduction in substrate reflectivity. Antireflective polymers were prepared using varying amounts of substituted azo dyes within the polymer backbone substituents:

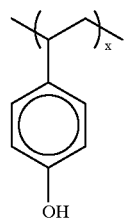

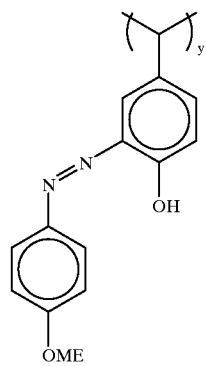

-continued

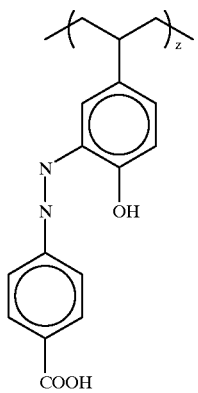

A polymer with this monomeric gave the followings n and k values when coated on oxide silicon:

$$k = -.05\left(\ln\frac{0.1}{P}\right)\left(\frac{\lambda}{4\pi t}\right)$$

Using this formula when solving for k, fibers of the following thickness provide the k values listed below:

$$k = \frac{\ln 0.1}{P}\frac{\lambda}{4\pi} - \frac{1}{2t} = -0.5\ln\frac{0.1}{P}\frac{\lambda}{4\pi t}$$

with p = 70%, λ = 365 nm

| | |
|---|---|
| t = 200 Å | k = 0.401 |
| t = 800 Å | k = 0.35 |
| t = 1000 Å | k = 0.281 |
| t = 1500 Å | k = 0.187 |
| t = 2000 Å | k = 0.140 | with p = 60%, λ = 365 nm

| | |
|---|---|
| t = 700 Å | k = 0.367 |
| t = 800 Å | k = 0.32 |
| t = 1000 Å | k = 0.256 |
| t = 1500 Å | k = 0.171 |
| t = 2000 Å | k = 0.128 |

TABLE 1

(t ≈ 2000Å 365 nm)

| | | mole % | | |
|---|---|---|---|---|
| n | k | x | y | z |
| 1.771 | 0.322 | 0 | 50 | 50 |
| 1.752 | 0.340 | 25 | 25 | 50 |
| 1.595 | 0.385 | 50 | 0 | 50 |

Another way to view the optical properties by using formula $\alpha = 4\pi k/\lambda$.

wherein α is optical absorption coefficient, k=refractive index imaginary, λ=wavelength of light (365 nm=0.365 mm), k=0.35, and α=12 Abs/μm.

Typically values 3–15 Abs/μm are needed for antireflective coating materials.

The unique aspect of these new polymers is their ability to be both developable in organic or aqueous bases (TMAH or KOH). Current systems commercially available (Barli from AZ Hoechst Celanese or XHRi from Brewer Science) are only developed through a dry etch (RIE) step. These materials could not be utilized with current bilayer liftoff schemes of the invention. The new polymer, however, can be used within the required film thickness necessary for a bilayer liftoff process (less than 2000A), be wet etchable with developers and still meet the criteria needed to be an effective antireflective coating material (k values near 0.3).

The concept may be extended from 193–436 nm depending upon the particular dye bound to the polymer. The polymer may also be made insoluble to developers using crosslinking agents within the polymer matrix or added to the formulation.

Example 1

Synthesis of Styrene-Azodye Copolymer

Con. HCl (6.7 mL) was added to a stirring ice-cooled mixture of o-aminophenol (2.45 g) in ice (30 g)/$H_2O$ (4 mL). Next a solution of $NaNO_2$ (1.6 g) in a minimum amount of $H_2O$ was added maintaining temperature below 5° C.

Separately, 50% NaOH (2.2 g) was added to a stirring ice-cooled solution of poly(4-hydroxystyrene-co-styrene) (5 g) in 20 mL MeOH. Next, the diazonium salt solution prepared above was added slowly maintaining temperature below 5° C. After addition the reaction temperature was maintained at 0–5° C. for 1 hour, then allowed to come to room temperature and stir overnight.

The next day the reaction was cooled with ice and conC. HCl (6.7 mnL) was added and stirred for 1 hour. The precipitate was filtered and rinsed with water. The solid was twice re-slurried in water and filtered, then rinsed with additional water and sucked dry. This polymer was then dried at 65° C. in a vacuum oven overnight giving an orange powder.

Example 2

Synthesis of H droxystyrene-Azodye Copolymer

Three drops of trifluoroacetic acid was added to a solution of o-aminophenol (1.1 g) and poly(4-hydroxystyrene) (2.45 g) in 45 mL of dioxane. To this was carefully added to-butylnitrite (1.4 g) in 10 mnL dioxane. A slow exotherm ensued to 30 deg. C which was controlled with a room temperature water bath. After stirring overnight the solution was poured into stirring water (500 mL), filtered and dried in a 65 deg C vacuum oven to given an orange solid.

Example 3

Synthesis and Absorption at 365 nm of Hydroxystyrene-Azodye Copolymer

Con. HCl (4.11 g) was diluted to 20.5 g with water. To this was added aniline (1.9 mL) using ice bath cooling. To this was added a saturated soultion of sodium nitrite (1.44 g) in water.

Separately poly(4-hydroxystyrene) (5 g) and 50% NaOH (3.3 g) were dissolved into methanol (25 mL) using ice cooling. To this was added the first solution dropwise. After stirring for 1 hour con HCl was added dropwise until pH=3. Approx. 100 mL water added to the reaction then filtered and sucked dry to give a brownish solid. This solid was taken up into a mixture of acetone/cyclohexanone (approx. 50 mL) and re-precipitated into water (750 mL), filtered, sucked dry then dried under high vacuum at 60 deg. C.

A 10% by weight solution of this polymer in cyclopentanone was spin coated onto a quartz wafer and baked at 150 deg. C for 2 min. The film had an optical density of 3 /μm at 365 nm.

Example 4

Synthesis and Absorption at 365 nm of A Hydroxystyrene-Azodye Copolymer

The procedure of Example 3 was used replacing the aniline with p-anisidine (2.6 g).

A 10% by weight cyclopentanone solution of the polymer so produced was spin cast onto a quartz wafer and baked on a hot plate at 152 deg. C for 2 min. The film had an optical density of 4.7/$\mu$m at 365 mn.

Example 5

Synthesis and Absorption at 365 nm of A Hydroxstyrene-Azodye Copolymer

The procedure of Example 3 was used replacing the aniline with p-aminobenzoic acid (2.86 g).

A 10% by weight cyclopentanone/NMP solution of the polymer produced was spin cast onto a quartz wafer and baked on a hot plate at 150 deg. C for 2 min. The film had an optical density of 3.4/$\mu$m at 365 nm.

Example 6

Synthesis an Absorption at 365 nm of 50/25/25 Terpolymer

ConC. HCl (68 mL) was added to a stirring ice-cooled mixture of p-anisidine (26 g) and p-aminobenzoic acid (28 g) in $H_2O$ (250 mL). Next a solution of $NaNO_2$ (28.8 g) in $H_2O$ (50 mL) was added maintaining temperature below 5° C.

Separately, 50% NaOH (76 g) was added to a stirring ice-cooled solution of poly(4-hydroxystyrene) (100 g) in 500 mL MeOH. Next, the diazonium solution prepared above was added slowly maintaining temperature below 5° C. After addition the reaction temperature was maintained at 0–5 ° C. for 1 hour, then allowed to come to room temperature and stir overnight.

The next day the reaction was cooled with ice and conC. HCl (168 mL) was added and stirred for 1 hour. The precipitate was filtered and rinsed with water. The solid was twice re-slurried in water (500 mL) and filtered, then rinsed with additional water and sucked dry. This polymer was then dried at 65° C. in a vacuum oven overnight affording approximately 150 g of a dark solid.

Example 7

Synthesis of A Hydroxystyrene-Azodye Copolymer

The procedure of Example 3 was used replacing the aniline with o-nitroaniline (2.88 g).

Example 8

Synthesis of A Hydroxystyrene-Triazole Copolymer

Copolymer from Example 5 (3.9 g) and 8N NaOH (50 mL) was dissolved in 50 mL EtOH and heated to 85–90 deg. C under nitrogen. To this was quickly added formamidine-sulfinic acid (2.4 g). After 1 hour the reaction was cooled with an ice bath and acidified to pH=3 with con. HCl, filtered, rinsed with water, sucked dry then dried in a 65 deg C vacuum oven overnight.

Example 9

PMGI/Dye Polymer Formulation and Absorbance at 365 nm 0.15 g of the polymer prepared in Example 6 was dissolved into 1.5 g of a 15% by weight solution of PMGI in cyclopentanone/NMP (Nano SFN15, MicroChem Corp.). This solution was filtered through a 0.45 $\mu$m filter prior to use. The solution was spin coated onto a quartz wafer (3000 rpm, 30 sec) and baked at 170 deg C for 10 minutes on a hot plate. The optical density was determined to be 3.1/um.

Example 10

Thin (Approx. 1400 Å) Antireflection Coating Solution 1 g of the dye polymer prepared in Example 6 was dissolved into 12 g of cyclopentanone and filtered through a 0.2 $\mu$m filter prior to use.

Example 11

Use of PMGI/Dye Polymer Admixture as Antireflection Coating

A solution of PMGI containing the dye polymer prepared as in Example 9 was spin coated on a silicon wafer and baked on a hot plate for 30 min. at 150 deg. C.

Over this was spin coated SJR 5440 (Shipley Company) photoresist which was then baked at 110 deg. C for 15 min. After exposure through a mask the resist was developed using Microposit 2401 (Shipley Co.) for 8 min. There was no evidence of intermixing between the resist and the underlayer.

Example 12

Use of 50/25125 As A Wet-Etchable Antireflective Layer

The solution of dye polymer from Example 11 was spin coated on a silicon wafer (3000 rpm, 30 sec) and baked at 150 deg. C for 3 min. on a hot plate. On top of this was spin coated ULTRA I-300 Photoresist (Shipley Company) (3000 K, 30 sec.) which was then baked at 90 deg. C for 2 min. The water was exposed through a mask at I-line and post-baked at 110 deg. C for 2 min., then developed using 1/2 AZ (Hoeschst-Celanese Corp.) water developer for 5 min. Crisp lithography with a measurable, undercut profile desirable for bilayer liftoff processing was obtained as shown in the FIGURE.

Example 13

Crosslinkable Antireflective Coating Formulation

To an 8.3% solution of the polymer prepared in Example 8 in cyclopentanone was added 0.07 g of 2,6-bis(4-azidobenzylidene)-4-methyl cyclohexanone. This was spin coated onto a silicon wafer and baked at 180 deg. C for 5 min. The coating was shown to be crosslinked by its insolubility in the casting solvent, cyclopentanone.

While the present invention has been particularly shown and described with reference to a preferred embodiment thereof, it will be understood by those skilled 30 in the art that various changes in form and detail may be made therein without departing from the spirit, scope and teaching of the invention. Accordingly, the invention herein disclosed is to be considered merely as illustrative and limited in scope only as specified in the appended claims

We claim:

1. An antireflective composition comprising a polyphenolic polymer comprising three monomers and having three repeating units having the formula:

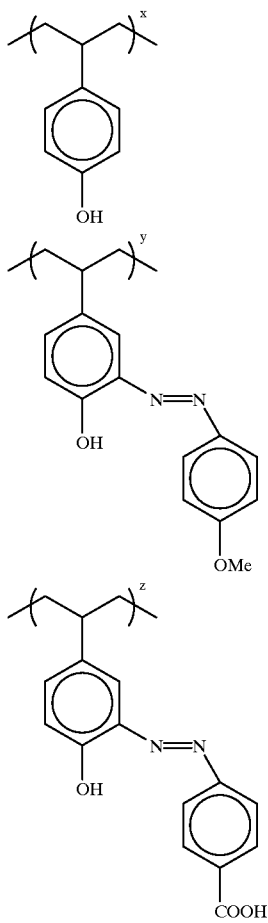

wherein x, y and z added together equal 1.

2. A method for generating a resist image on a substrate, comprising the steps of:

(a) coating a substrate with an antireflective layer comprising a polyphenolic polymer said polymer comprising three monomers and having three repeating units having the formula:

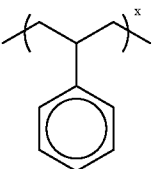

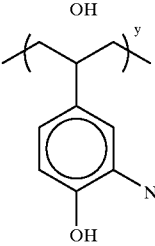

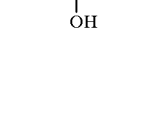

wherein x, y and z added together equal 1;

(b) coating the antireflective layer with a layer of photoresist;

(c) imagewise exposing the photoresist to radiation;

(d) developing the image in the photoresist layer; and (e) transferring the image through the antireflective layer to the substrate.

* * * * *